(12) United States Patent
Cheon et al.

(10) Patent No.: US 10,658,441 B2
(45) Date of Patent: May 19, 2020

(54) ORGANIC LIGHT-EMITTING DIODE DISPLAYS WITH REFLECTORS

(71) Applicant: Apple Inc., Cupertino, CA (US)

(72) Inventors: Kwang Ohk Cheon, San Jose, CA (US); Cheng Chen, San Jose, CA (US); Chien Lu, New Taipei (TW); Chih-Lei Chen, Tai Chung (TW); Chin Wei Hsu, Hsinchu (TW); Hui Lu, Cupertino, CA (US); KiBeom Kim, Cupertino, CA (US); Lun Tsai, Zhubei (TW); Meng-Huan Ho, San Jose, CA (US); Nai-Chih Kao, Taoyuan (TW); Pei-Ling Lin, New Taipei (TW); Rui Liu, San Jose, CA (US); Shan-Jen Yu, Taoyuan (TW); Wendi Chang, Santa Clara, CA (US); Yusuke Fujino, Taoyuan (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/114,039

(22) Filed: Aug. 27, 2018

(65) Prior Publication Data
US 2019/0067394 A1    Feb. 28, 2019

Related U.S. Application Data

(60) Provisional application No. 62/551,140, filed on Aug. 28, 2017.

(51) Int. Cl.
*H01L 27/32*    (2006.01)
*H01L 51/50*    (2006.01)
(Continued)

(52) U.S. Cl.
CPC ....... *H01L 27/3246* (2013.01); *G09G 3/3225* (2013.01); *H01L 27/323* (2013.01);
(Continued)

(58) Field of Classification Search
None
See application file for complete search history.

(56) References Cited

U.S. PATENT DOCUMENTS 9,105,875 B2 * 8/2015 Kim ............... H01L 51/5275
9,484,554 B2 * 11/2016 Kim ............... H01L 51/5271
(Continued)

FOREIGN PATENT DOCUMENTS

CN    204391161    6/2015

OTHER PUBLICATIONS

Freitag, White Top-Emitting OLEDs on Metal Substrates, Dissertation, Technische University at Dresden, 312 pages, 2010.
(Continued)

*Primary Examiner* — Michelle Mandala
(74) *Attorney, Agent, or Firm* — Treyz Law Group, P.C.; Kendall W. Abbasi (57) ABSTRACT

A display may have an array of pixels formed from organic light-emitting diodes and thin-film transistor circuitry. Each pixel may include organic layers interposed between an anode and a cathode. The organic layers may emit outcoupled light that escapes the display and waveguided light that is waveguided within the organic layers. A reflector may be placed at the edge of the organic layers to reflect the waveguided light out of the display. The reflector may be located within a pixel definition layer and may be formed from metal or may be formed from one or more interfaces between high-refractive-index material and low-refractive-index material. The reflector may be formed from an extended portion of the pixel anode. The reflector may be formed from light-reflecting particles that are suspended in the pixel definition layer.

16 Claims, 9 Drawing Sheets

(51) Int. Cl.
*G09G 3/3225* (2016.01)
*H01L 51/56* (2006.01)
*H01L 51/52* (2006.01)

(52) U.S. Cl.
CPC ...... *H01L 27/3211* (2013.01); *H01L 27/3283* (2013.01); *H01L 51/5056* (2013.01); *H01L 51/5092* (2013.01); *H01L 51/5209* (2013.01); *H01L 51/5212* (2013.01); *H01L 51/5237* (2013.01); *H01L 51/5271* (2013.01); *H01L 51/56* (2013.01); *H01L 2251/5369* (2013.01)

(56) References Cited

U.S. PATENT DOCUMENTS

| | | | | |
|---|---|---|---|---|
| 9,502,593 | B2* | 11/2016 | Kim | H01L 31/02327 |
| 9,634,281 | B2* | 4/2017 | Choi | H01L 51/5218 |
| 9,653,524 | B2* | 5/2017 | Kim | H01L 27/3246 |
| 2004/0113550 | A1 | 6/2004 | Adachi et al. | |
| 2007/0063628 | A1 | 3/2007 | Cok et al. | |
| 2011/0310128 | A1* | 12/2011 | Han | H01L 25/048 |
| | | | | 345/672 |
| 2012/0032582 | A1* | 2/2012 | Chang | H01L 27/3269 |
| | | | | 313/504 |
| 2013/0140597 | A1* | 6/2013 | Kim | H01L 51/0013 |
| | | | | 257/98 |
| 2014/0061605 | A1 | 3/2014 | Kim et al. | |
| 2018/0033355 | A1* | 2/2018 | Lee | G09G 3/20 |
| 2020/0035770 | A1* | 1/2020 | Jiang | H01L 27/3246 |

OTHER PUBLICATIONS

Zhao et al., "Approaches to high performance white organic light-omitting diodes for general lighting", Institude of Polymer Optoelectronic Materials and Devices, State Key Laboratory of Luminescent Materials and Devices, South China University of Technology, Guangzhou 510640, P.R. China, 45 pages, Feb. 20, 2017.

Rand, "External vs. internal OLED outcoupling strategies" Department of Electrical Engineering and Andlinger Center for Energy and the Environment, 2016 DOE SSL R&D Workshop, Feb. 4, 2016, Raleigh, NC URL<https://www.energy.gov/sites/prod/files/2016/02/f29/rand_oled-substrates_raleigh2016.pdf>.

* cited by examiner

ORGANIC LIGHT-EMITTING DIODE DISPLAYS WITH REFLECTORS

This application claims the benefit of provisional patent application No. 62/551,140, filed Aug. 28, 2017, which is hereby incorporated by reference herein in its entirety.

BACKGROUND

This relates generally to electronic devices with displays and, more particularly, to electronic devices with organic light-emitting diode displays.

Electronic devices often include displays. Displays such as organic light-emitting diode displays include arrays of pixels that emit light to display images for a user. The pixels of a display may include subpixels of different colors to provide the display with the ability to display color images. The organic light-emitting diodes are controlled by thin-film transistor circuitry.

It can be challenging to achieve high efficiency from an organic light-emitting diode display without sacrificing off-axis viewing quality. Typically, higher on-axis efficiency results in worse off-axis color variation. Off-axis color variation can be reduced, but usually this is at the expense of on-axis efficiency.

It would therefore be desirable to be able to provide improved organic light-emitting diode displays.

SUMMARY

A display may have an array of pixels on a substrate. The display may be an organic light-emitting diode display and the pixels may include organic light-emitting diodes of different colors. The display may include thin-film transistor circuitry that controls the organic light-emitting diode pixels.

Each organic light-emitting diode may have an anode, a cathode, and organic layers between the anode and cathode. The organic layers may emit out-coupled light that escapes the display and waveguided light that is waveguided within the organic layers. A reflector may be placed at the edge of the organic layers to reflect the waveguided light out of the display. The reflector may completely or partially surround each organic light-emitting diode in the display.

The reflector may be located within a pixel definition layer or may replace a pixel definition layer in the display. The reflector may be formed from metal or may be formed from one or more interfaces between high-refractive-index material and low-refractive-index material. The reflector may be formed from an extended portion of the pixel anode. The reflector may be formed from light-reflecting particles that are suspended in the pixel definition layer. An opaque portion of the pixel definition layer may be used to prevent color mixing between adjacent pixels.

By reflecting the waveguided light out of the organic layers, the reflector may help increase the overall extraction efficiency of the display. Additionally, the reflector may help mitigate cavity effects at wide viewing angles by increasing off-axis efficiency and reducing off-axis color variation.

DETAILED DESCRIPTION

Figure 1:
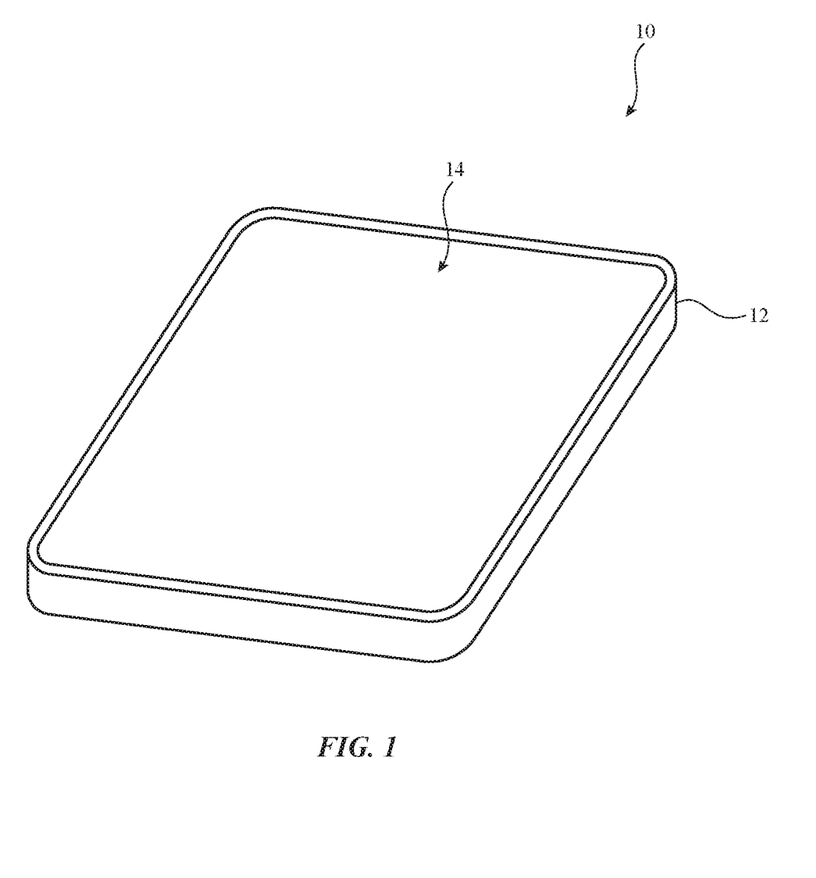
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a computer monitor or other display containing an embedded computer or other electronic equipment, a computer display or other monitor that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. Configurations in which display 14 is an organic light-emitting diode display are sometimes described herein as an example. The use of organic light-emitting diode pixels to form display 14 is merely illustrative. Display 14 may, in general, be formed using any suitable type of pixels.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
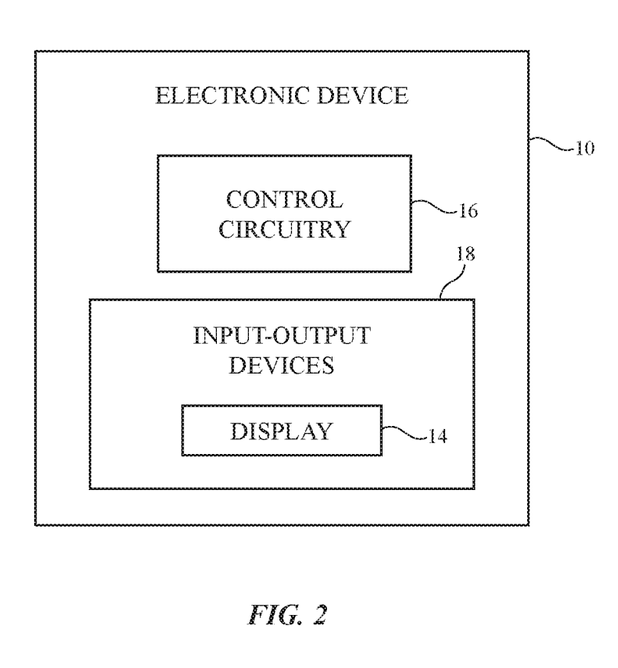
FIG. 2 is a schematic diagram of an illustrative electronic device having a display in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 3:
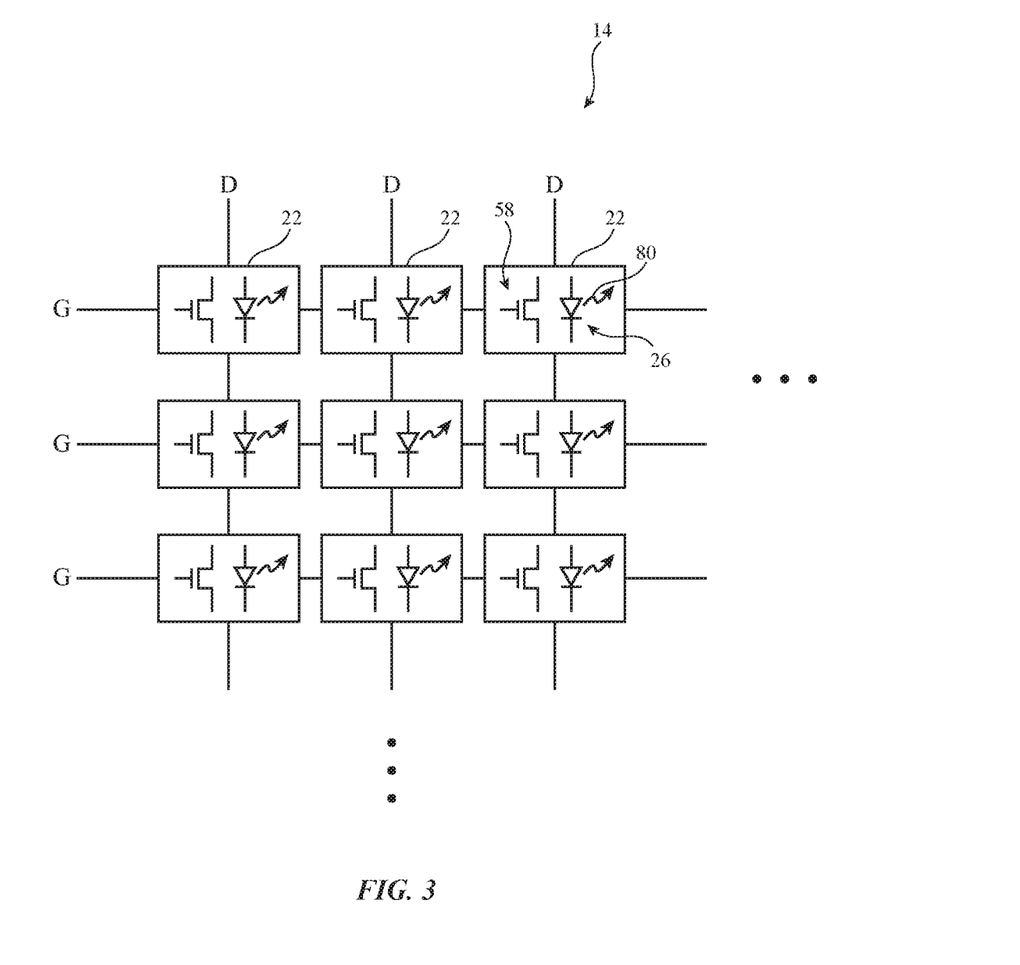
FIG. 3 is a top view of an illustrative display in an electronic device in accordance with an embodiment.

A top view of a portion of display 14 is shown in FIG. 3. As shown in FIG. 3, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 80 under the control of a pixel control circuit formed from transistor circuitry such as thin-film transistors 58 and thin-film capacitors). Transistors 58 may be polysilicon thin-film transistors, semiconducting-oxide thin-film transistors such as indium gallium zinc oxide transistors, or transistors formed from other semiconductors.

Figure 4:
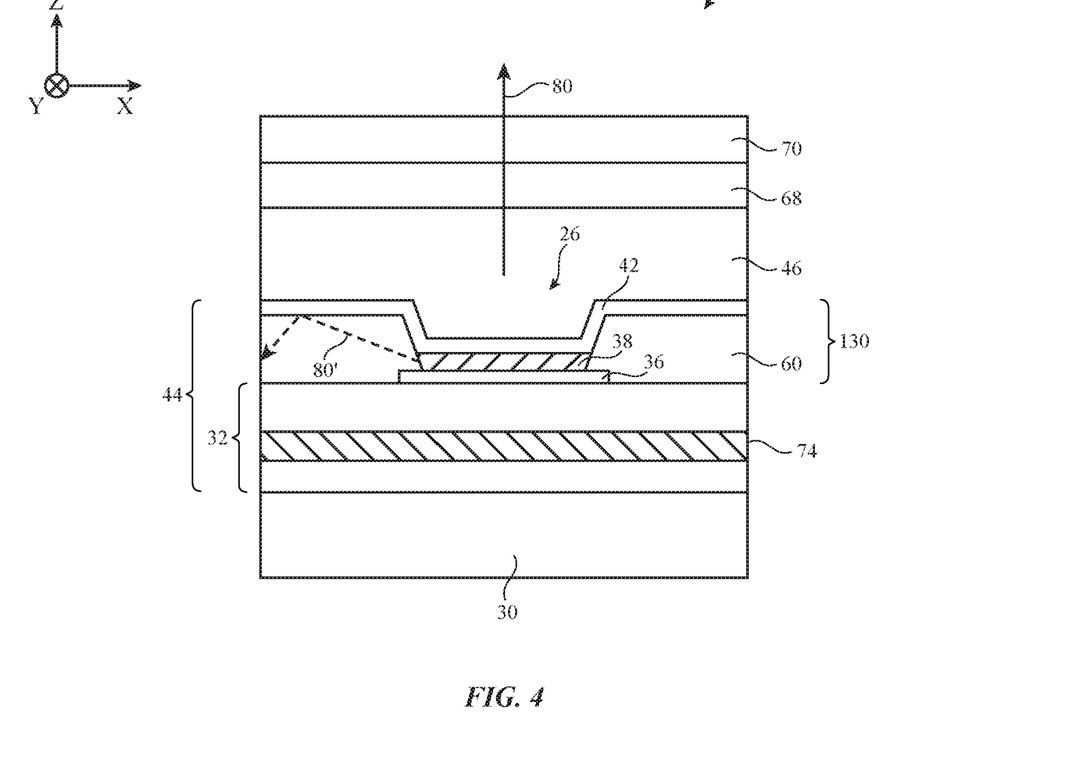
FIG. 4 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 4. As shown in FIG. 4, display 14 may include a substrate layer such as substrate layer 30. Substrate 30 may be formed from polymer, glass, sapphire, a semiconductor material such as silicon, or other suitable materials.

Thin-film transistor circuitry 44 may be formed on substrate 30. Thin-film transistor circuitry 44 may include layers 32. Layers 32 may include inorganic layers such as inorganic buffer layers, barrier layers (e.g., barrier layers to block moisture and impurities), gate insulator, passivation, interlayer dielectric, and other inorganic dielectric layers. Layers 32 may also include organic dielectric layers such as a polymer planarization layer. Metal layers and semiconductor layers may also be included within layers 32. For example, semiconductors such as silicon, semiconducting-oxide semiconductors, or other semiconductor materials may be used in forming semiconductor channel regions for thin-film transistors 58 (FIG. 3). Metal in layers 32 such as metal traces 74 may be used in forming transistor gate terminals, transistor source-drain terminals, capacitor electrodes, and metal interconnects.

As shown in FIG. 4, thin-film transistor circuitry 44 may include diode anode structures such as anode 36. Anode 36 may be formed from a layer of conductive material such as metal on the surface of layers 32 (e.g., on the surface of a planarization layer that covers underlying thin-film transistor structures). Light-emitting diode 26 may be formed within an opening in pixel definition layer 60. Pixel definition layer 60 may be formed from a patterned photoimageable polymer such as polyimide and/or may be formed from one or more inorganic layers such as silicon nitride, silicon dioxide, or other suitable materials.

In each light-emitting diode, layers of organic material 38 may be interposed between a respective anode 36 and cathode 42. Anodes 36 may be patterned from a layer of metal (e.g., silver, aluminum, or other suitable metal) and/or one or more other conductive layers such as a layer of indium tin oxide, molybdenum oxide (MoOx), titanium nitride (TiNx), or other transparent conductive material. Cathode 42 may be formed from a common conductive layer that is deposited on top of pixel definition layer 60. Cathode 42 may be formed from a thin metal layer (e.g., a layer of metal such as a magnesium silver layer) and/or indium tin oxide or other transparent conductive material. Cathode 42 is preferably sufficiently transparent to allow light 80 to exit light-emitting diode 26.

Anode 36 may be formed from one or more layers of non-conducting materials (e.g., silicon oxide (SiOx), silicon nitride (SiNx), or polymers) with a top layer of conductive transparent material (e.g., indium tin oxide, indium gallium zinc oxide, etc.) and a bottom layer of reflective metal (e.g., silver, aluminum, a compound of reflective metals, etc.).

The example of FIG. 4 in which the anode of diode 26 is formed from a patterned conductive layer and the cathode of diode 26 is formed from a blanket conductive layer is merely illustrative. If desired, anode 36 may be formed from a blanket conductive layer and cathode 42 may be formed from a blanket conductive layer. The configuration of display 14 in which a transparent blanket cathode layer 42 covers diodes that have individually patterned anodes 36 allows light 80 to be emitted from the top of display 14 (i.e., the example of FIG. 4 in which display 14 is a "top emission" organic light-emitting diode display) is also merely illustrative. Display 14 may be implemented using a bottom emission configuration if desired. Layers such as layers 36, 38, and 42 are used in forming organic light-emitting diodes such as diode 26 of FIG. 4, so this portion of display 14 is sometimes referred to as an organic light-emitting diode layer (see, e.g., layer 130 of FIG. 4).

Metal interconnect structures may be used to interconnect transistors and other components in circuitry 44. Metal interconnect lines may also be used to route signals to capacitors, to data lines D and gate lines G, to contact pads (e.g., contact pads coupled to gate driver circuitry), and to other circuitry in display 14. As shown in FIG. 4, layers 32 may include one or more layers of patterned metal for forming interconnects such as metal traces 74 (e.g., traces 74 may be used in forming data lines D, gate lines G, power supply lines, clock signal lines, and other signal lines).

If desired, display 14 may have a protective outer display layer such as cover layer 70. The outer display layer may be formed from a material such as sapphire, glass, plastic, clear ceramic, or other transparent material. Protective layer 46 may cover cathode 42. Layer 46, which may sometimes be referred to as a thin film encapsulation layer, may include moisture barrier structures, encapsulant materials such as polymers, adhesive, and/or other materials to help protect thin-film transistor circuitry.

Functional layers 68 may be interposed between layer 46 and cover layer 70. Functional layers 68 may include a touch sensor layer, a circular polarizer layer, and other layers. A circular polarizer layer may help reduce light reflections from reflective structures such as anodes 36 and cathode 42. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover layer 70 (e.g., a layer of glass, sapphire, polymer, or other suitable material) and functional layers 68 to underlying display layers such as layer 46, thin-film transistor circuitry 44, and substrate 30.

Organic layers 38 may include an organic emissive layer (e.g., a red emissive layer in red diodes 26 that emits red light, a green emissive layer in green diodes 26 that emits green light, a blue emissive layer in blue diodes 26 that emits blue light, a combination of red, green, and blue emissive materials that emit white light, etc.). The emissive material may be a material such as a phosphorescent material or fluorescent material that emits light during diode operation. The emissive material in layer 38 may be sandwiched between additional diode layers such as hole injection layers, hole transport layers, electron injection layers, and electron transport layers.

During operation, holes and electrons are injected into organic layers 38 from anode 36 and cathode 42, respectively. When an electron meets a hole, an electron-hole pair is formed and photons are released. The photons generated in organic layers 38 may be emitted at different angles. Some of the light generated in organic layers 38 such as light 80 will be emitted parallel to (or within a given angle of) the z-axis of FIG. 4 and will escape display 14. This type of light is sometimes referred to as "air mode" light or "out-coupled mode" light. Other light generated in organic layers 38 such as light 80' may be emitted at a non-zero angle relative to the z-axis of FIG. 4 and may be reflected when it strikes an interface between a low-refractive-index layer and a high-refractive-index layer at a certain angle. Light that bounces back and forth within the organic layers of an organic light-emitting diode is sometimes referred to as "waveguide mode" light because the light is waveguided within the organic layers.

If care is not taken, waveguide mode light may become trapped and absorbed within the light-emitting diode device and may be unable to escape the display, thereby sacrificing light extraction efficiency (i.e., the ratio of photons generated in a light-emitting diode to photons escaping the display).

Figure 5:
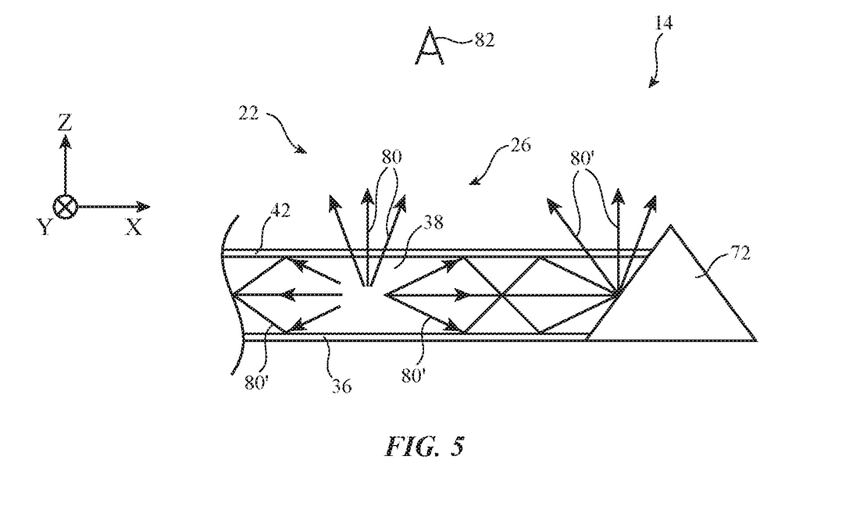
FIG. 5 is a cross-sectional side view of a portion of an illustrative organic light-emitting diode subpixel having a reflector in accordance with an embodiment.

To increase the light extraction efficiency of display 14, reflective structures may be used to help extract the waveguide mode light from display 14. FIG. 5 is a cross-sectional side view of a portion of display 14 illustrating how a reflective structure may be used to help extract waveguide mode light from display 14. As shown in FIG. 5, light-emitting diode 26 may include organic layers 38 interposed between cathode 42 and anode 36. Light-emitting diode 26 may emit light in different directions. Light 80 that is emitted within a given angle of the z-axis is extracted from display 14 as air mode light. Light 80' that is emitted at wider angles, however, may be reflected at interfaces between low-refractive-index materials and a high-refractive-index materials and may be guided within device 26 via total internal reflection. To help extract waveguide mode light 80', a reflector such as reflector 72 may be placed at one or more edges of organic layers 38. Reflector 72 may have an angled surface relative to the z-axis (i.e., angled relative to the surface normal of substrate 30 of FIG. 4) such that waveguide mode light 80' is directed out of display 14 towards viewer 82. Reflector 72 may, for example, be angled between 25 and 35 degrees from the z-axis, between 20 degrees and 45 degrees from the z-axis, between 0 and 90 degrees from the z-axis, about 30 degrees from the z-axis, less than 30 degrees from the z-axis, or more than 30 degrees from the z-axis.

Reflector 72 may be formed from metal that has been deposited and patterned, sheet metal (e.g., stamped sheet metal), metallized polymer film, a thin-film metal on a plastic carrier, a dielectric thin-film stack that forms a dielectric mirror (a thin-film interference mirror) on a polymer film or molded plastic carrier, an interface between a high-refractive-index material and a low-refractive index material, a white reflective film (e.g., a glossy white polymer sheet formed from a white ink layer or other white layer on a polymer carrier covered with a glossy coating such as a glossy polymer coating), or other suitable reflector structure. Reflector 72 may have a rectangular ring-shaped outline (e.g., a rectangular footprint when viewed from above) or may have other suitable shapes.

By reflecting waveguide mode light 80' out of organic layers 38, reflector 72 may help increase the overall extraction efficiency of display 14. Additionally, whereas air mode light 80 may be subject to spectrum narrowing and color variation at wide viewing angles (e.g., due to cavity effects), waveguide mode light 80' has a broader spectrum and less sensitivity to viewing angle. As such, not only does reflector 72 increase the overall extraction efficiency of display 14, but it also mitigates cavity effects at wide viewing angles (sometimes referred to as off-axis viewing angles) by increasing off-axis efficiency and reducing off-axis color variation.

Figure 6:
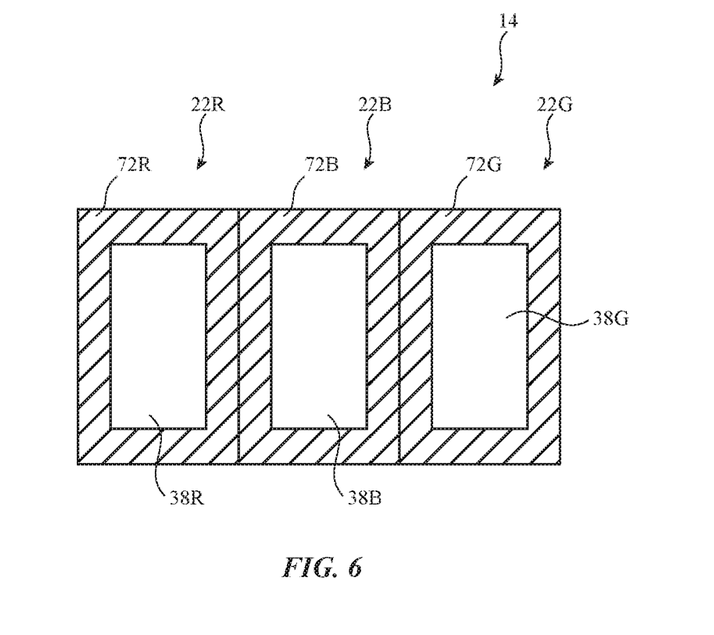
FIG. 6 is a top view of illustrative subpixels having reflectors that surround the organic layers of the subpixels in accordance with an embodiment.

FIG. 6 is a top view of illustrative pixels in display 14. Pixels in display 14 may include color pixels (sometimes referred to as subpixels) such as red pixel 22R, blue pixel 22B, and green pixel 22G. As shown in FIG. 6, each pixel may include an organic light-emitting diode surrounded by an associated reflector. For example, red pixel 22R may include light-emitting diode 26R surrounded by reflector 72R, blue pixel 22B may include light-emitting diode 26B surrounded by reflector 72B, and green pixel 22G may include light-emitting diode 26G surrounded by reflector 72G. The example of FIG. 6 in which reflectors 72 completely surround light-emitting diodes 26 is merely illustrative. If desired, reflectors 72 may only partially surround light-emitting diodes 26, reflectors 72 may be located on one, two, three, or four sides of light-emitting diodes 26, a reflector 72 on one side of light-emitting diode 26 need not contact a reflector 72 on an adjacent side of light-emitting diode 26, reflectors 72 in one pixel need not contact reflectors 72 in an adjacent pixel, etc. Reflectors 72 may be located in the non-emitting portion of each pixel 22 (sometimes referred to as the inactive area of pixels 22). Reflectors 72 may have the same structure for all pixels in display 14 or reflectors 72 may have different structures for different pixels. For example, reflectors 72 may have a different shape, size, and/or structure for different color pixels, if desired.

Figure 7:
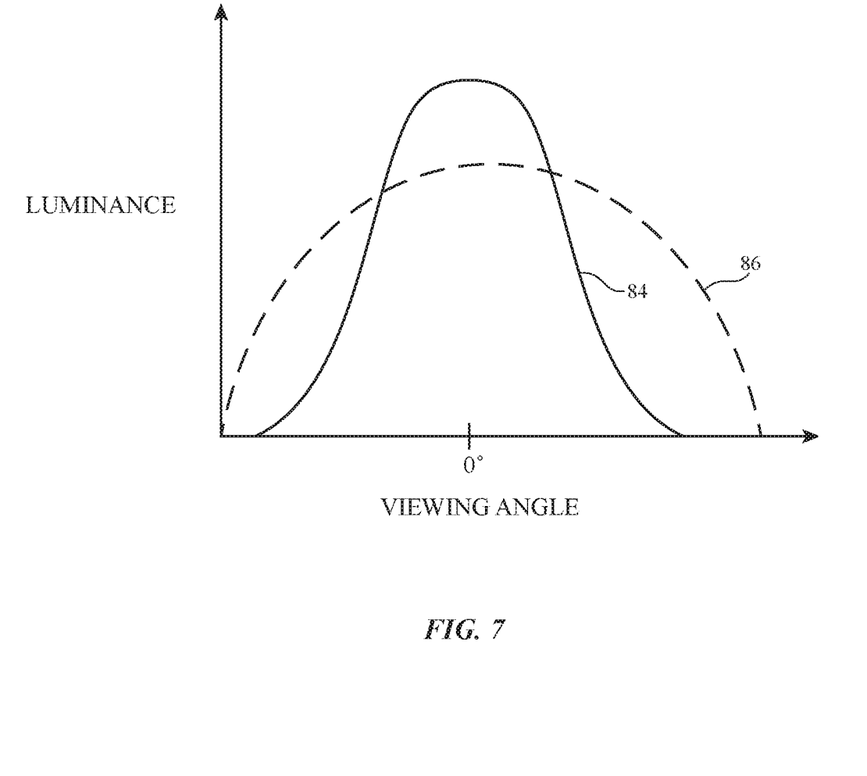
FIG. 7 is a graph showing how recycling the waveguide mode light of an organic light-emitting diode subpixel increases efficiency at wide viewing angles in accordance with an embodiment.

FIG. 7 is a graph showing how off-axis viewing of display 14 may be improved using a reflector such as reflector 72 to extract waveguide mode light from organic layers 38. Curve 84 represents air mode light (e.g., light 80 of FIG. 5) emitted from display 14, and curve 86 represents waveguide mode light (e.g., light 80' of FIG. 5) emitted from display 14. For on-axis viewing (e.g., around 0°), air mode light is highly efficient and therefore achieves relatively high luminance. In arrangements where the light-emitting diodes of display 14 include micro-cavities (e.g., in which light is reflected up and down within the pixel layers before exiting display 14), a spectral narrowing can occur that causes off-axis efficiency to decrease and color variation to increase at wide viewing angles. The recycling of waveguide mode light 80' (curve 86) mitigates these affects by adding broader spectrum light with less color variation at wide viewing angles.

FIGS. 8-15 show cross-sectional side views of illustrative reflectors 72 that may be used to recycle waveguide mode light 80' as discussed in connection with FIGS. 5-7. In these examples, reflectors 72 are located between red pixel 22R and blue pixel 72B. However, it should be understood that this is merely illustrative and that the reflectors of FIGS. 8-15 may be used between any suitable pair of pixels in display 14. It should also be understood that any one of the embodiments shown in FIGS. 8-15 may be combined with any one or more of the other embodiments shown in FIGS. 8-15, if desired.

Figure 8:
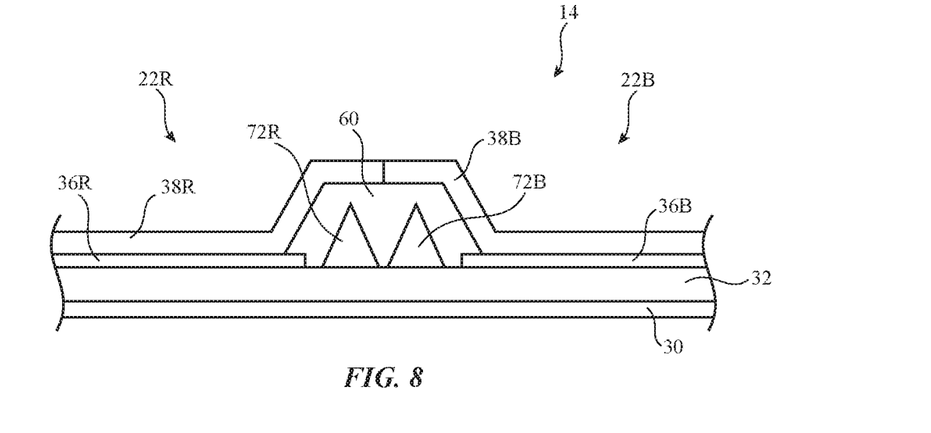
FIG. 8 is a cross-sectional side view of a portion of an illustrative display including first and second angled reflectors between first and second light-emitting diodes in accordance with an embodiment.

In the example of FIG. 8, reflectors 72R and 72B are located in pixel definition layer 60. Reflector 72R may be used to reflect waveguide mode light within organic layers 38R out of display 14, and reflector 72B may be used to reflect waveguide mode light within organic layers 38B out of display 14. As discussed in connection with FIG. 5, reflector 72 may be formed from sheet metal (e.g., stamped sheet metal), metallized polymer film, a thin-film metal on a plastic carrier, a dielectric thin-film stack that forms a dielectric mirror (a thin-film interference mirror) on a polymer film or molded plastic carrier, an interface between a high-refractive-index material and a low-refractive index material, a white reflective film (e.g., a glossy white polymer sheet formed from a white ink layer or other white layer on a polymer carrier covered with a glossy coating such as a glossy polymer coating), or other suitable reflector structure. In arrangements where reflector 72 is formed from an interface between a high-refractive-index material and a low-refractive index material, reflector 72 may be formed from a material that has a lower or higher refractive index than surrounding pixel definition layer 60. For example, if pixel definition layer 60 has a refractive index of about 1.7, reflectors 72R and 72B may have a lower refractive index at about 1.4, or may have a higher refractive index at about 2.3. Materials having other refractive indices may be used, if desired. These examples are merely illustrative.

Figure 9:
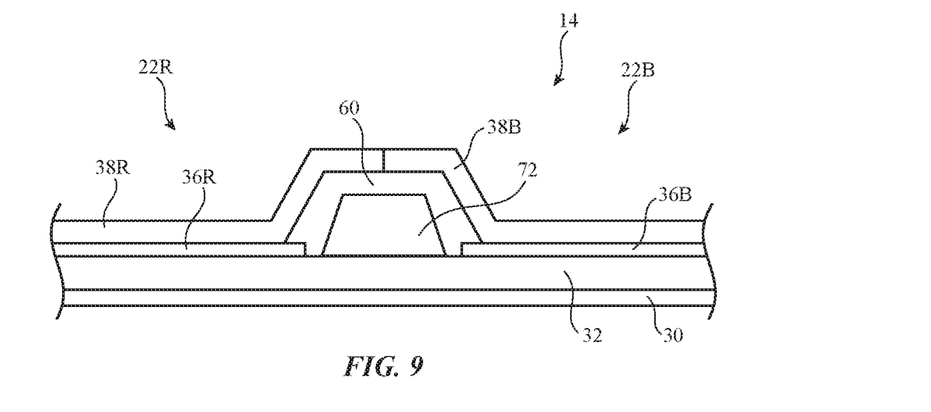
FIG. 9 is a cross-sectional side view of a portion of an illustrative display including an angled reflector between first and second light-emitting diodes in accordance with an embodiment.

In the example of FIG. 9, reflector 72 between adjacent pixels 22R and 22B is formed from a single structure (rather than the two separate structures shown in FIG. 8). The structure may have a first angled surface that reflects waveguide mode light from organic layers 38R out of display 14 and a second opposing angled surface that reflects waveguide mode light from organic layers 38B out of display 14.

Figure 10:
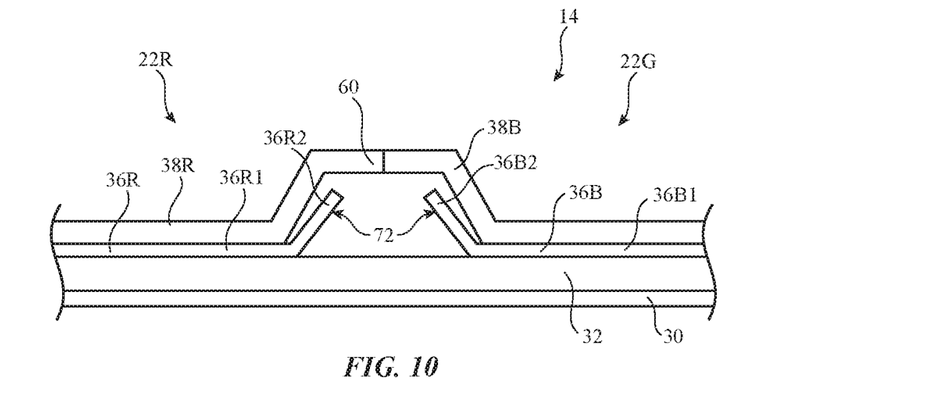
FIG. 10 is a cross-sectional side view of a portion of an illustrative display including first and second reflectors formed from angled anodes between first and second light-emitting diodes in accordance with an embodiment.

In the example of FIG. 10, reflectors 72 are formed from extended portions of the anodes in pixels 22. Anode 36R of red pixel 22R has a first portion 36R1 that is parallel to substrate 30 and a second portion 36R2 that is angled relative to substrate 30. Anode 36B of blue pixel 22B has a first portion 36B1 that is parallel to substrate 30 and a second portion 36B2 that is angled relative to substrate 30. Because anodes 36R and 36B are reflective (e.g., around 95% reflective), extended portion 36R2 may reflect waveguide mode light from organic layers 38R out of display 14 and extended portion 36B2 may reflect waveguide mode light from organic layers 38B out of display 14.

Figure 11:
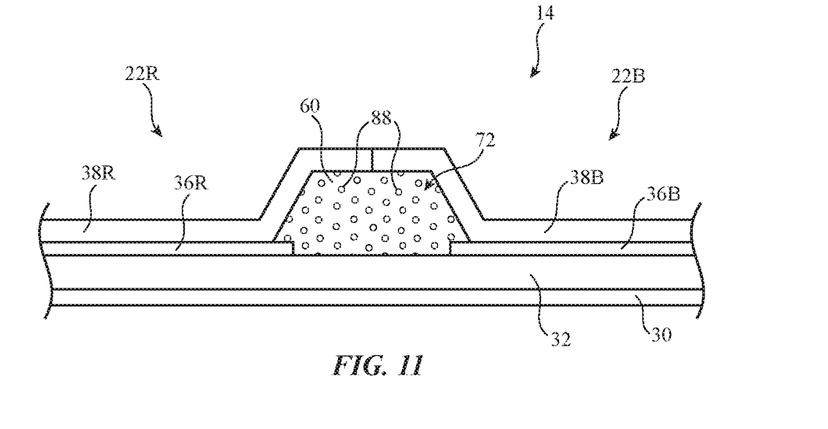
FIG. 11 is a cross-sectional side view of a portion of an illustrative display including light-scattering particles between first and second light-emitting diodes in accordance with an embodiment.

In the example of FIG. 11, reflector 72 is formed from light-reflective particles 88 within pixel definition layer 60. Particles 88 may be titanium dioxide particles, silica composite particles, other ceramic particles, or other reflective particles. In the example of FIG. 11, particles 88 are suspended in pixel definition layer 60. If desired, particles 88 may be suspended in other materials (e.g., particles 88 may be suspended within a matrix such as a matrix formed from epoxy, acrylic, silicone, or other polymer materials within or on layer 60).

Figure 12:
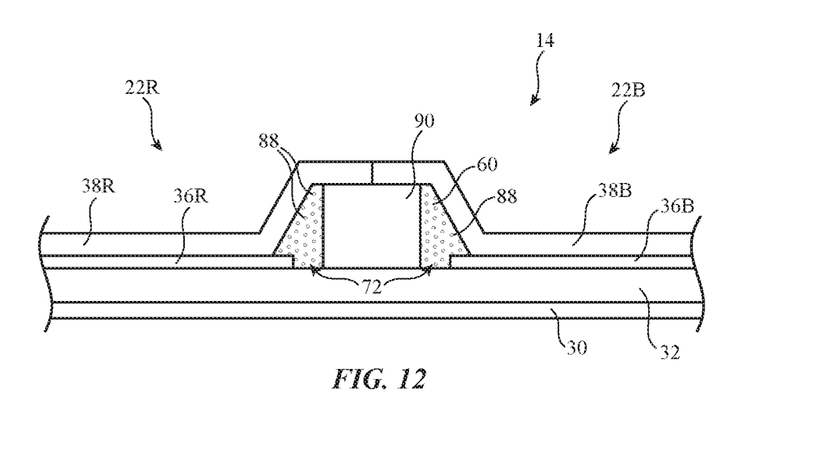
FIG. 12 is a cross-sectional side view of a portion of an illustrative display including light-scattering particles on opposing sides of a light-blocking material between first and second light-emitting diodes in accordance with an embodiment.

In the example of FIG. 12, reflector 72 is formed from light-reflective particles 88 on opposing sides of a light-blocking structure such as light-blocking structure 90. Light-blocking structure 90 may be an opaque (e.g., black) portion of pixel definition layer 60 or may be other suitable light-blocking structure or opaque coating. Light-blocking structure 90 may help prevent color mixing between adjacent pixels.

Figure 13:
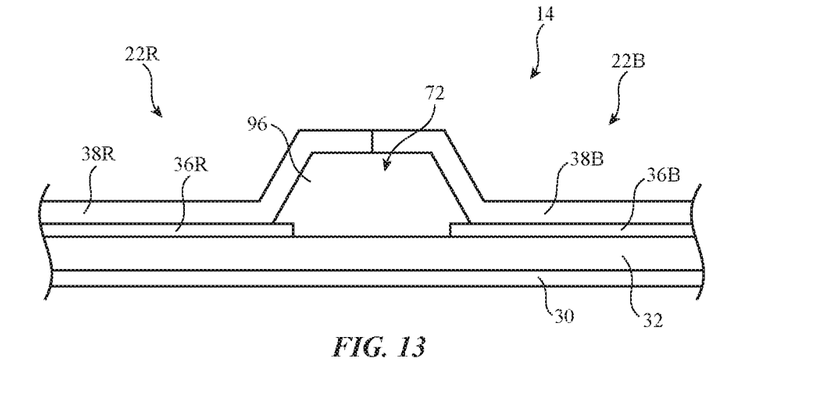
FIG. 13 is a cross-sectional side view of a portion of an illustrative display including low-refractive-index material between first and second light-emitting diodes in accordance with an embodiment.

In the example of FIG. 13, reflector 72 is formed from a low-refractive-index material 96. The difference in refractive index between organic layers 38 and low-refractive index material 96 may cause waveguide mode light out of diode 26. Low-refractive-index material 96 may have a refractive index that is less than 1.6, for example, or may have other suitable refractive index that is lower than the refractive index of organic layers 38R and 38B. If desired, low-refractive index material 96 may replace pixel definition layer 60.

Figure 14:
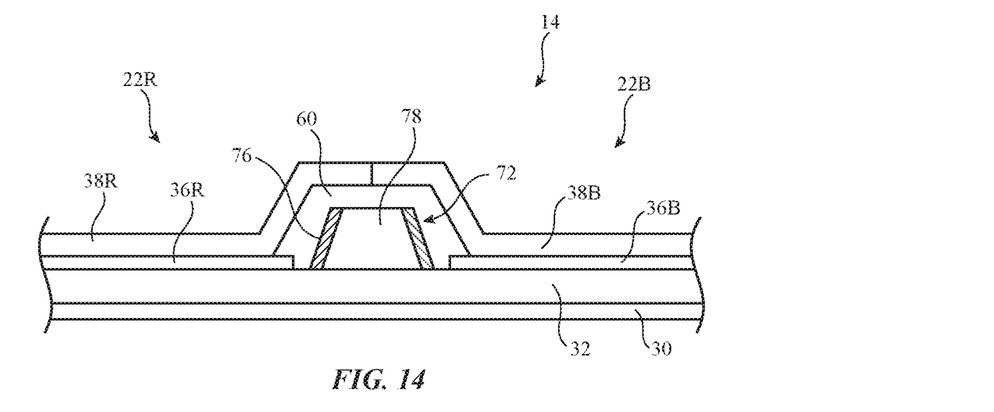
FIG. 14 is a cross-sectional side view of a portion of an illustrative display including reflective coatings within a pixel definition layer between first and second light-emitting diodes in accordance with an embodiment.

In the example of FIG. 14, reflector 72 is formed from reflective coatings 76 on structure 78. Structure 78 may be formed from polymer, metal, or other suitable material. If desired, structure 78 may be formed from the same material as pixel definition layer 60. Coating 76 may be metallized polymer film, a thin-film metal, a dielectric thin-film stack that forms a dielectric mirror (a thin-film interference mirror) on a polymer film or molded plastic carrier, an interface between a high-refractive-index material and a low-refractive index material, a white reflective film (e.g., a glossy white polymer sheet formed from a white ink layer or other white layer on a polymer carrier covered with a glossy coating such as a glossy polymer coating), or may be a coating of reflective particles suspended in a matrix.

Figure 15:
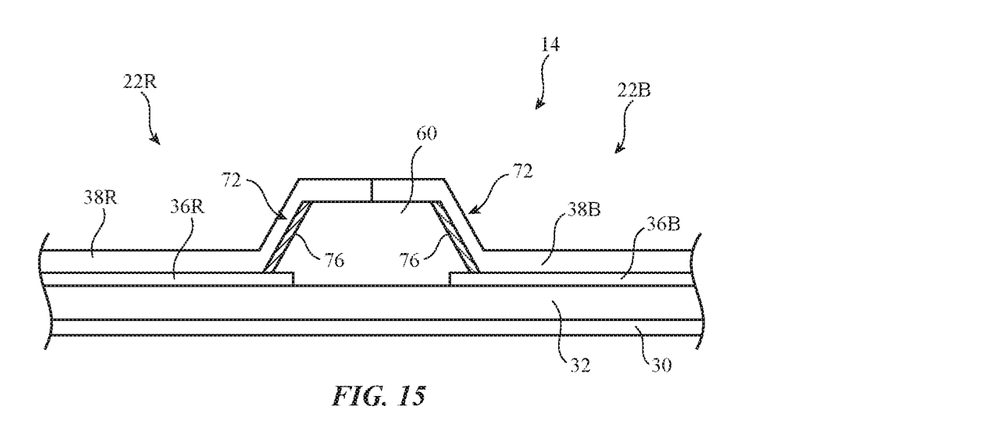
FIG. 15 is a cross-sectional side view of a portion of an illustrative display including reflective coatings on a pixel definition layer between first and second light-emitting diodes in accordance with an embodiment.

In the example of FIG. 15, reflectors 72 are formed from reflective coatings 76 that are formed on opposing outer surfaces of pixel definition layer 60 (rather than being formed within pixel definition layer 60 as in the example of FIG. 14).

The foregoing is merely illustrative and various modifications can be made by those skilled in the art without departing from the scope and spirit of the described embodiments. The foregoing embodiments may be implemented individually or in any combination.

What is claimed is:

1. An organic light-emitting diode display, comprising:
   a substrate having an upper surface;
   first and second light-emitting diodes on the substrate each comprising organic layers interposed between a reflective electrode and a transparent electrode;
   a pixel definition layer between the first and second light-emitting diodes; and
   a reflector embedded within the pixel definition layer, wherein the reflector is separate from the reflective electrode and has a surface that reflects light from the organic layers out of the display through the transparent electrode, and wherein the surface is angled with respect to the upper surface of the substrate.

2. The organic light-emitting diode display defined in claim 1 wherein the reflective electrode and the transparent electrode comprise an anode and a cathode, respectively.

3. The organic light-emitting diode display defined in claim 1 wherein the reflector comprises metal.

4. The organic light-emitting diode display defined in claim 1 wherein the reflector surrounds the first light-emitting diode.

5. The organic light-emitting diode display defined in claim 4 further comprising an additional reflector in the pixel definition layer.

6. The organic light-emitting diode display defined in claim 5 wherein the additional reflector surrounds the second light-emitting diode.

7. The organic light-emitting diode display defined in claim 1 wherein the reflector comprises light-reflective particles suspended in the pixel definition layer.

8. The organic light-emitting diode display defined in claim 7 further comprising a light-blocking layer in the pixel definition layer, wherein a first group of the light-reflective particles are located on a first side of the light-blocking layer and are configured to reflect light emitted from the first light-emitting diode out of the display, and wherein a second group of the light-reflective particles are located on a second side of the light-blocking layer and are configured to reflect light emitted from the second light-emitting diode out of the display.

9. The organic light-emitting diode display defined in claim 1 wherein the pixel definition layer has a refractive index below 1.6.

10. A display, comprising:
    a substrate having an upper surface;
    a pixel definition layer having an array of openings;
    an array of organic light-emitting diodes in the openings, wherein each of the organic light-emitting diodes comprises a transparent electrode; and
    a reflector surrounding each organic light-emitting diode in the display, wherein the reflector is located within the pixel definition layer and has a surface that reflects light out of the display through the transparent electrode, wherein the surface is angled with respect to the upper surface of the substrate.

11. The display defined in claim 10 wherein the reflector comprises light-reflective particles.

12. The display defined in claim 10 wherein each organic light-emitting diode has an anode, wherein the anode has a first portion that is parallel to the substrate and a second portion that is angled relative to the substrate, and wherein the second portion forms the reflector.

13. The display defined in claim 10 wherein the transparent electrode comprises a cathode, wherein each organic light-emitting diode has organic layers interposed between an anode and the cathode, and wherein the pixel definition layer has a refractive index that is lower than a refractive index of the organic layers.

14. An organic light-emitting diode pixel, comprising:
    a cathode;
    an anode having an upper surface;
    organic layers between the cathode and the anode, wherein the organic layers emit out-coupled light that escapes the organic light-emitting diode pixel and waveguided light that is waveguided within the organic layers;
    a reflector at the edge of the organic layers having a surface that reflects the waveguided light out of the organic light-emitting diode pixel, wherein the surface is angled with respect to the anode; and
    a pixel definition layer surrounding the organic light-emitting diode, wherein the reflector is located within the pixel definition layer and is separated from the anode by the pixel definition layer.

15. The organic light-emitting diode pixel defined in claim 14, wherein the reflector comprises metal.

16. The organic light-emitting diode pixel defined in claim 14 wherein the reflector comprises light-reflecting particles suspended in the pixel definition layer, wherein the pixel definition layer has an opaque portion, and wherein the light-reflecting particles are interposed between the opaque portion and the organic layers.

* * * * *